US006834419B2

United States Patent
Lopatin et al.

(10) Patent No.: US 6,834,419 B2
(45) Date of Patent: Dec. 28, 2004

(54) METHOD OF PRODUCING SENSOR ELEMENT

(75) Inventors: Sergej Lopatin, Lörrach (DE); Igor Getman, Lörrach (DE); Anatoliy Panitch, Rostow-on-Don (RU); Yuriy Wusewker, Rostow-on-Don (RU)

(73) Assignee: Endress + Hauser GmbH + Co., Maulberg (DE)

( * ) Notice: Subject to any disclaimer, the term of this patent is extended or adjusted under 35 U.S.C. 154(b) by 0 days.

(21) Appl. No.: 10/704,162

(22) Filed: Nov. 7, 2003

(65) Prior Publication Data

US 2004/0095041 A1 May 20, 2004

Related U.S. Application Data

(62) Division of application No. 09/733,487, filed on Dec. 8, 2000, now Pat. No. 6,710,517.

(30) Foreign Application Priority Data

Apr. 27, 2000 (DE) .......................................... 100 20 549

(51) Int. Cl.⁷ ........................ H04R 17/00; H01L 41/06; H01L 41/08
(52) U.S. Cl. .......................... 29/25.35; 29/835; 29/832; 29/837; 29/831; 29/841; 29/852; 29/417; 310/328
(58) Field of Search ............................ 29/25.35, 835, 29/832, 837, 831, 841, 852, 417; 310/328, 363, 365, 366, 364

(56) References Cited

U.S. PATENT DOCUMENTS

| 2,479,987 | A | | 8/1949 | Williams |
| 2,933,628 | A | | 4/1960 | Samuelson |
| 4,499,566 | A | | 2/1985 | Abbott |
| 4,752,712 | A | * | 6/1988 | Tomita et al. ............... 310/328 |
| 4,816,713 | A | | 3/1989 | Chang |
| 4,845,399 | A | * | 7/1989 | Yasuda et al. ............... 310/366 |
| 4,918,350 | A | | 4/1990 | Ando et al. |
| 5,053,693 | A | * | 10/1991 | Bohnert et al. ............... 324/96 |
| 5,055,734 | A | * | 10/1991 | Grawey et al. ............. 310/366 |
| 5,155,409 | A | | 10/1992 | Swanson et al. |
| 5,168,189 | A | * | 12/1992 | Dam et al. ................... 310/328 |
| 5,191,316 | A | | 3/1993 | Dreyer |
| 5,300,852 | A | | 4/1994 | Isogai et al. |
| 5,382,865 | A | * | 1/1995 | Butcher et al. ............. 310/366 |
| 5,459,371 | A | | 10/1995 | Okawa et al. |
| 5,523,645 | A | * | 6/1996 | Inoi ............................ 310/364 |
| 5,945,770 | A | | 8/1999 | Hanafy |
| 6,274,388 | B1 | | 8/2001 | Aggarwal et al. |

FOREIGN PATENT DOCUMENTS

| DE | 39 31 453 C1 | 2/1991 |
| EP | 0 826 643 A1 | 3/1998 |
| JP | 6 010 3685 | 6/1985 |
| JP | 1 28 3069 | 5/1988 |
| JP | 3 159 277 | 7/1991 |
| JP | 4 361 575 | 12/1992 |

* cited by examiner

Primary Examiner—Carl J. Arbes
Assistant Examiner—Tai Nguyen
(74) Attorney, Agent, or Firm—Bose McKinney & Evans LLP

(57) ABSTRACT

The invention relates to an electromechanical drive or a sensor element composed of piezoelectric elements arranged in the form of a stack. The drive or the sensor element is intended for measurement instruments and operates even at very high temperatures.

The new drive or the new sensor element (10) for this purpose comprises a number of piezoelectric ceramic layers (12a–f), with electrode layers (16a–e) in each case being arranged between two mutually facing surfaces of directly adjacent piezoelectric ceramic layers. Connectors (18a,b) in the form of wires run in grooves (14a–d) in the electrode layers (16a–e) in order to make electrical contact with the electrode layers (16a–e), and are passed out of the electrode layers (16a–e).

6 Claims, 4 Drawing Sheets

METHOD OF PRODUCING SENSOR ELEMENT

RELATED APPLICATIONS

This application is a divisional of application Ser. No. 09/733,487 filed Dec. 8, 2000 now U.S. Pat. No. 6,710,517, which claims the benefit of German Application No. 100 20 549.6, filed Apr. 27, 2000, the disclosures of which are hereby expressly incorporated by reference.

FIELD OF THE INVENTION

The invention relates to an electromechanical drive or a sensor element for a measurement instrument, and a method for their production. It relates in particular to drives and sensor elements manufactured in the form of stacks and composed of piezoelectric elements, and to measurement instruments equipped with such drives and sensor elements.

BACKGROUND AND SUMMARY OF THE INVENTION

Known measurement instruments of this type include, for example, piezoelectric acceleration sensors and level measurement instruments. These measurement instruments generally comprise a base body on which the drive or the sensor element is fitted, with these items containing piezoelectric elements, electrodes and electrical connectors and connections. The piezoelectric elements are electrically connected to one another, and are connected to an electronics circuit appropriate to the application.

Such piezoelectric measurement instruments are relatively highly sensitive to electrostatic charges and have relatively low transverse sensitivity. However, their particular disadvantage is their relatively limited effective operating range at high temperatures above, for example, 200° C., under the influence of high static pressures of up to, for example, 500 bar or, in the case of acceleration sensors, when subject to high dynamic loads, during which accelerations of up to 2000 g occur.

The sensitivity of the piezoelectric measurement instruments to the described loads is dependent on the design of their drive or sensor element. Normally, such a drive or such a sensor element is formed from piezoelectric elements which follow one another and are geometrically matched to one another, electrodes as well as electrical connectors and connections. Various materials, such as piezoceramic and metal, are thus combined with one another and their moduli of elasticity and their respective coefficients of thermal expansion differ. Extended mechanical planar stresses, which reduce not only the strength of the sensor element but also the wanted signal or measurement signal, are produced in the piezoelectric elements themselves under the influence of the said high temperatures and/or large static and dynamic loads on the sensor element or on the drive.

In known measurement instruments of the described type, a monolithic thin-film capacitor with a layer structure has also been found to be advantageous, which may also be in the form of a multiple capacitor composed of thin layers, for example for level measurement instruments. In this case, the layer sequence of the monolith comprises the piezoelectric thin films and electrodes, with electrical connectors being provided, arranged along the monolith. Normally, a connector (often also referred to as a "rail") then connects the electrodes of the one pole, and another connector connects the electrodes of the other pole. Such a monolithic structure is highly robust, has high strength and allows vibration parameters to be measured very accurately by reducing the relative coefficients of the transverse transformation.

However, this structure is based on an asymmetric electrode shape, with a projecting part for connection to a rail on one side and with an isolating clearance from the other rail on the opposite side. Inhomogeneities in the structural design of such drives or sensor elements have a negative effect on the magnitude of the relative transverse transformation coefficient, however. Furthermore, the asymmetric shape of the electrodes does not allow the entire electrode area of the piezoelectric layers to be charged up, as would be desirable in order to enlarge the transverse transformation coefficient. The smaller the metallization area of the piezoelectric layer under consideration in comparison with its actual useful area, the greater is the extent to which the transformation coefficient is reduced.

The invention is thus based on the object of specifying piezoelectric drives and sensor elements, and a method for their production which allow the disadvantages described above to be avoided with measurement instruments equipped in such a way, and which are also distinguished by high measurement accuracy under the influence of high temperatures, and high static and dynamic loads.

This object is achieved by a first variant of the invention by means of an electromechanical drive or a sensor element having a layer structure, which comprises a plurality of piezoelectric ceramic layers, an electrode layer which is arranged between two mutually facing surfaces of directly adjacent piezoelectric ceramic layers, and an electrical connector for making electrical contact with the electrode layer, in which case the connector is likewise arranged and is passed out between the two mutually facing surfaces of the piezoelectric ceramic layers.

This object is furthermore achieved by a second variant of the invention by means of an electromechanical drive or sensor element having a layer structure, having a plurality of piezoelectric ceramic layers, in which mutually facing surfaces of directly adjacent piezoelectric ceramic layers are metallized by application of a metal coating, which are joined together by means of diffusion welding, so that an electrode layer is formed by the metallized surfaces, with which contact can be made via an electrical connector.

One preferred embodiment of the invention provides that a groove is provided in at least one of the two mutually facing surfaces of the piezoelectric ceramic layers and at least partially holds the electrical connector.

In another preferred embodiment of the invention, the connector is a wire which extends beyond the surfaces of the piezoelectric ceramic layers.

In yet another preferred embodiment of the drive or sensor element according to the invention, at least three piezoelectric ceramic layers and at least two grooves are provided, with these grooves being arranged offset with respect to one another and with respect to a longitudinal axis of the drive or sensor element.

In a development of a preferred embodiment of the invention, the wire has a rippled or zigzag structure.

In other developments of the invention, the piezoelectric ceramic layers are composed of PZT material, such as $PbMg_{0.308}Nb_{0.617}Ti_{0.075}O_3$, or they are formed from ceramic layers composed of a material having a Curie temperature of more than 400° C., for example composed of $Na_{0.5}Bi_{4.5}Ti_4O_{15}$ or $Bi_3TiNbO_9$.

In other developments of the invention, the electrode layers are composed of a metallic material having a Curie temperature of more than 400° C., such as bismuth-titanate.

Other developments, in addition, of the invention relate to wires composed of a metallic material having high-temperature stability at more than 250° C. and wires composed of a material which contains silver and stainless steel, or a material which contains a nickel alloy.

The said object on which the invention is based is, furthermore, achieved by an electromechanical drive or a sensor element having a layer structure which is produced using a method which comprises the following steps:

- production of ceramic layers composed of electrically active material using a method which is normal in ceramic technology, having desired dimensions and having a margin of 2–3 mm for each dimension taking account of the following mechanical machining;
- grinding the ceramic layers until a predetermined thickness of, for example, 0.15 to 03 mm is reached;
- cutting a groove in one face of the ceramic layers which is to be metallized;
- in which case the depth of the groove must be no deeper than half the thickness of the ceramic layer under consideration;
- coating at least one face of the ceramic layers with metal by applying a paste containing silver twice and subsequent heat treatment at a temperature of 800–820° C.;
- applying adhesive to the metallized surfaces of two ceramic layers using cellulose adhesive;
- diffusion welding of the layers to which adhesive has been applied by heat treatment at a temperature of 780–800° C. and single-axis compression at a pressure of 3–5 kg/cm² over a period of 3 hours and cooling to room temperature;
- drawing in each case one connector wire into a groove;
- action of an electric field on the wires at high temperature and setting of the desired polarity of the electrode layers by connection of the same poles of the drive or of the sensor element;
- checking of the desired parameters and piezoelectric characteristics of the drive or of the sensor element.

In addition, a level limit switch is provided which is equipped with a drive and a sensor element according to the invention, with the sensor element in a development of such a level limit switch being separated from the drive by a non-polarized ceramic layer.

Furthermore, an acceleration sensor is provided, having a sensor element according to the invention.

The particular advantage is that the construction according to the invention and the production method according to the invention make it possible to produce a piezoelectric drive or a sensor element in which the charge transformation coefficient and the measurement accuracy of the sensor element are improved in that the relative transverse transformation coefficient is reduced over a wide temperature range and during high static and dynamic loads.

The invention will be explained and described in detail in the following text using a number of exemplary embodiments and with reference to a drawing, in which:

DESCRIPTION OF THE PREFERRED EMBODIMENT

Figure 1:
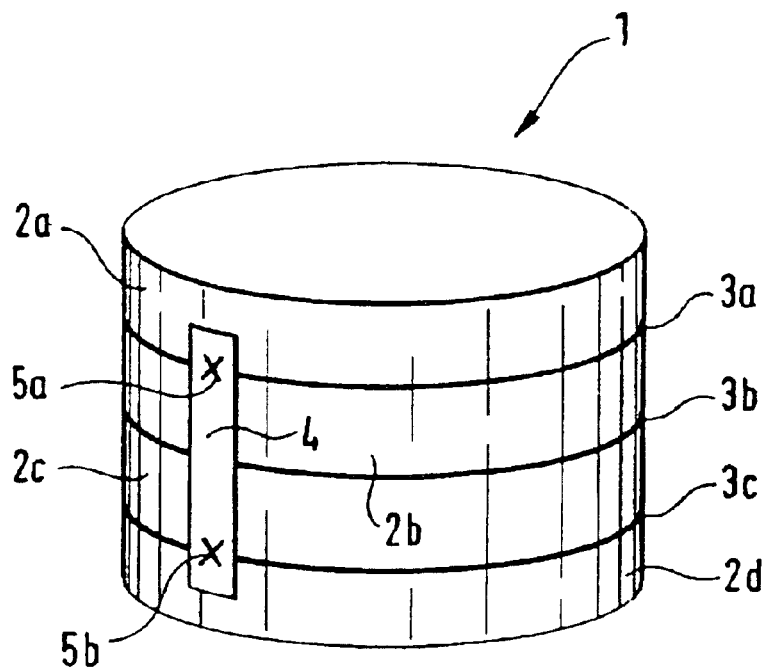
FIG. 1 shows a perspective illustration of a multilayer, previously known piezoelectric drive or sensor element.

In order to make it possible to illustrate the major differences between the invention and the prior art, FIG. 1 shows a previously known piezoelectric drive, or a previously known piezoelectric sensor element 1. This will be referred to in the following text, and for the sake of simplicity, as the piezoelectric element 1. Essentially, it comprises piezoceramic disks 2a, b, c, d, in which at least one of the mutually facing surfaces is metallized and which, with electrodes 3a, b, c inserted in-between, are arranged on top of one another and are joined to one another in the normal way and so as to produce a structure of a monolithic layer capacitor. FIG. 1 also shows a metallic connector 4 which is in the form of a strip, is fitted externally to the outer surface of the piezoelectric element 1 and electrically connects the electrodes 3a and 3c to one another at two connection points 5a and 5b. Another connector of the same type is normally fitted on the other side of the outer surface of the piezoelectric element 1, and is in turn electrically connected to the electrode 3b, although this cannot be seen in FIG. 1 owing to the chosen nature of the illustration. Electrical connecting conductors, which are not shown here, can normally be connected to both connectors to form drive or evaluation electronics, which are likewise not shown here for the sake of simplicity.

In order to prevent the connector 4, which is in the form of a strip, producing an undesired contact with the electrode 3b, it must be cut away at the point where the connector 4 is provided and, so to speak, must be recessed into the interior of the piezoelectric element 1. It thus cannot cover the entire available area of the disk 2b (or 2c) which, as mentioned initially, has a negative influence on the transformation coefficient at this point on the piezoelectric element 1. The same applies to the electrode 3a, and to the connector which cannot be seen here. It also has to ensure a reasonable separation from the connector, in order to avoid an undesired contact.

Another disadvantage of the known piezoelectric element 1 in FIG. 1 has likewise already been mentioned in the introduction. Metallic connectors which are flat or in the form of strips, such as the connector 4, have a thermal expansion behavior at relatively high temperatures which differs significantly from that of the ceramic disks 2a–d. This thermal effect can be of such a magnitude that the connection points 5a, b can be destroyed, thus calling the entire function of the piezoelectric element 1 into question.

Figure 2:
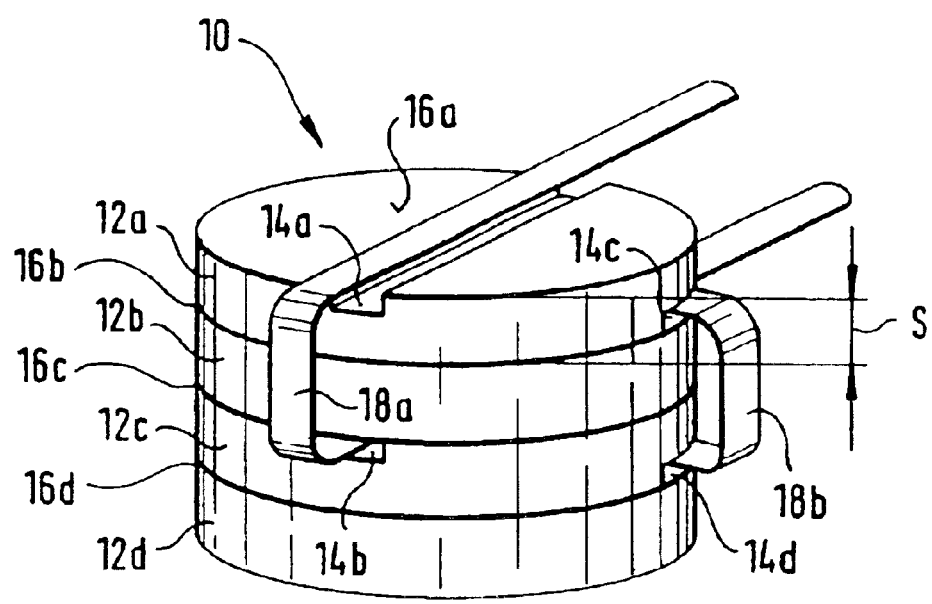
FIG. 2 shows a perspective illustration of a first embodiment of a multilayer piezoelectric drive or sensor element according to the invention.

A piezoelectric drive or a sensor element 10 as illustrated in FIG. 2, which is a first and preferred embodiment of the invention, is more advantageous. The piezoelectric element 10, which is constructed to form a monolithic layer capacitor, in this example comprises four piezoceramic disks 12a, 12b, 12c, 12d into each of which grooves 14a and 14b are cut, as well as grooves 14c and 14d which are arranged offset through approximately 180° with respect to the former. As will be explained later, the grooves 14a–d are cut into the finished, machined ceramic disks 12a–d. That surface of each of the ceramic disks 12a–d which contains the groove 14a–d is metallized over its complete surface together with the disk, as is shown from the example of the layer denoted by 16a. Once the ceramic disks 12a–d have been joined together in the manner shown in FIG. 2, preferably by diffusion welding, the metallized layers form electrode layers 16a, 16b, 16c, 16d over the entire surface. The electrode layers 16a and 16c are conductively connected to one another by means of a wire, which is pulled into the grooves 14a and 14b, as the connector 18a.

In this case, undesirable contacts with other electrode layers can easily be avoided by the connector projecting slightly beyond the outer surface of the piezoelectric element 10. FIG. 2 shows a connector 18b, which is in the form of a wire, connects the electrode layers 16b and 16d, and has been pulled into the grooves 14c and 14d in a similar way to the connector 18a. A further electrical connecting conductor for drive or measurement electronics can in each case easily be connected to the connectors.

It is, of course, not absolutely essential for the invention for the connectors 18a and 18b to be arranged in the form of the loops shown by way of example in FIG. 2. It is just as possible for the connectors, which are in the form of wires, each to be pulled through the grooves as individual sections, that is to say in the sense of individual wires, and for the individual wires to be connected to one another in the desired manner only after this has been done. Thus, if desired, each individual electrode can in principle be actuated individually. The connectors 18a and 18b, which are in the form of wires, ensure a permanent connection for the electrodes even at high temperatures, and allow an electrode layer over the complete area.

For strength reasons, it is recommended that the grooves be cut no deeper into the ceramic layers than half the thickness of the respective ceramic disk illustrated by "S" in FIG. 2. In practice, it has been found to be particularly advantageous for the groove depth to correspond approximately to 0.3 times the thickness of the relevant ceramic disk.

The ceramic disks are preferably produced from PZT material. The suitability of the piezoelectric element 20 according to the invention is further improved if the ceramic disks are composed of $PbMg_{0.308}Nb_{0.617}Ti_{0.075}O_3$. The piezoelectric ceramic disks are particularly suitable for high temperatures if they are composed of a material having a Curie temperature of more than 400° C., for example being composed of $Na_{0.5}Bi_{4.5}Ti_4O_{15}$ or $Bi_3TiNbO_9$.

The characteristics of the materials which are used for the electrode layers and for the connectors in the form of wires should be matched to those of the materials used for the ceramic disks. It is thus recommended that a metallic material having a Curie temperature of more than 400° C. be used for the electrode layers, preferably a material composed of bismuth-titanate. For the connectors in the form of wires, it has been found to be particularly advantageous to use a material having high-temperature stability of more than 250° C., with preference being given to wires composed of a material containing silver and stainless steel, or a material with a nickel alloy.

Figure 3:
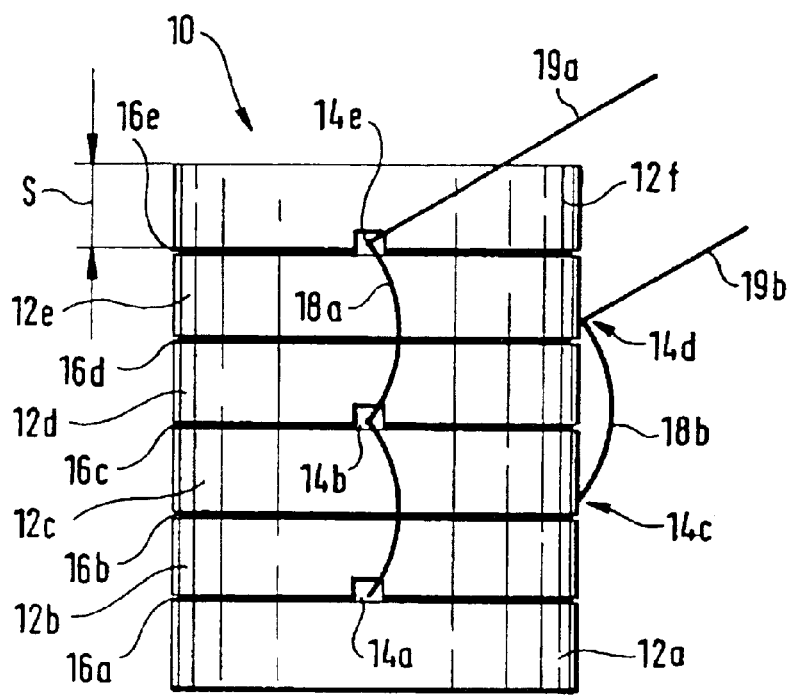
FIG. 3 shows a schematic side view of an upgraded drive or sensor element as shown in FIG. 2.

In order to illustrate the versatile options and configurations which result using a piezoelectric element 10 according to the invention, FIG. 3 shows a piezoelectric element 10 upgraded such that it is virtually "standing on its head" in comparison with that in FIG. 2 and which now has six ceramic disks 12a, 12b, 12c, 12d, 12e, 12f, five grooves 14a, 14b, 14c, 14d, 14e and, correspondingly, five electrode layers 16b, 16c, 16d, 16e, 16f. As a continuation of the design shown in FIG. 2, the connector 18a, which is in the form of a wire, does not just run in the grooves 14a, 14b and 14e and thus connects the electrode layers 16a, 16c, 16e to the same polarity, in the same way that the connector 18b, which is in the form of a wire, does for the electrode layers 16b and 16d. Apart from this, what has been said above with regard to the piezoelectric element 10 illustrated in FIG. 2 also applies here in the same way.

Figure 4:
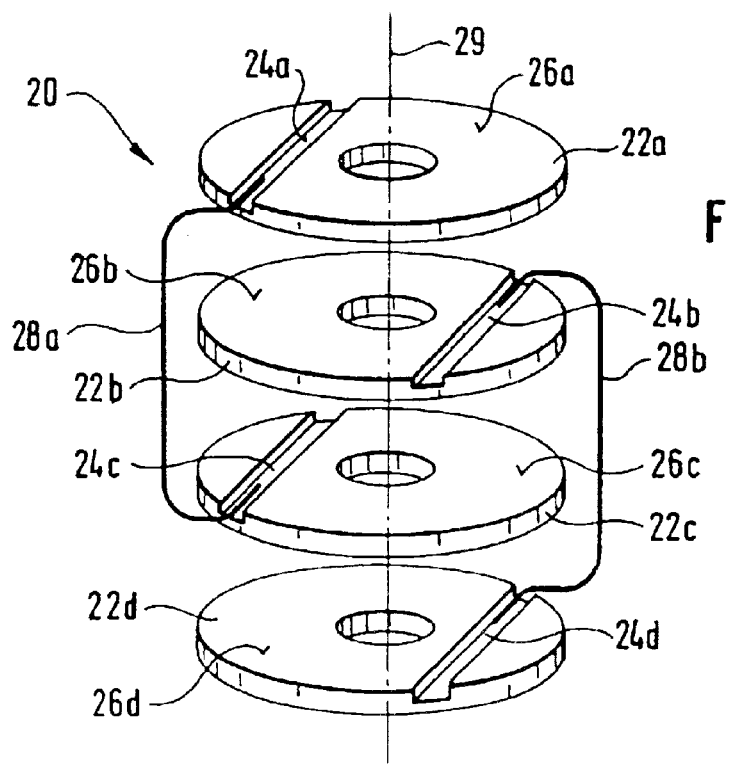
FIG. 4 shows a schematic illustration of a number of layers of a second embodiment of a piezoelectric drive or sensor element according to the invention.

FIG. 4 shows a second and preferred embodiment of a piezoelectric drive or sensor element according to the invention. This sensor element or drive which, for the sake of simplicity, as above, is referred to as the piezoelectric element 20, is illustrated in such a way that the ceramic disks 22a, 22b, 22c, 22d, which are shown spaced apart from one another, clearly show the profile of the grooves 24a, 24b, 24c, 24d cut into them. In contrast to the grooves 14a–e shown in FIGS. 2 and 3, the grooves 24a–d do not run through the center of the ceramic disks 22a–d. The grooves 24a–d do not cut a longitudinal axis 29 shown in FIG. 4 but run in the general sense of a secant with respect to the circular surfaces, shown by way of example here, of the ceramic disks 22a–d.

Although the position of the grooves 24a–d is intrinsically arbitrary, they should, however, in a similar way to the grooves 14a–d in FIG. 2, once again run such they are arranged offset from one ceramic disk to the other, to be precise preferably in such a way that there is no possibility of any overlap of connectors 28a or 28b, respectively, arranged in the grooves 24a and 24c, or 24b and 24d, respectively. The distance between the grooves 22a–d and the edge of the ceramic disks 22a–d must be aligned on the basis of the requirements for the mechanical strength of the ceramic disks 22a–d. It has been found that it is preferable to arrange the grooves half way between the longitudinal axis 29 and the edge of the respective ceramic disk.

The metallized surfaces from which the electrode layers are formed by joining the ceramic disks 22a–d together (see also FIG. 2 and FIG. 3 in this context) are denoted by "26a, 26b, 26c, 26d" in FIG. 4. Apart from this, what has already been said with regard to the embodiments of the invention illustrated in FIGS. 2 and 3 applies here.

Figure 5:
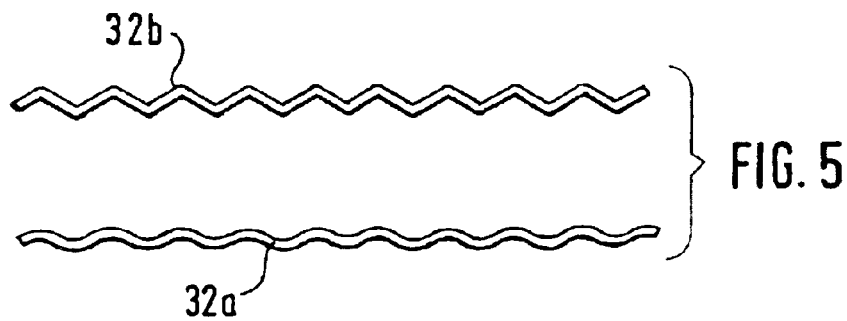
FIG. 5 shows schematic side views of two specially shaped wires for a drive or a sensor element according to the invention.

By way of example, FIG. 5 shows two different embodiments of the connectors 18a,b and 28a,b (see FIGS. 2 to 4) which are in the form of wires and which have been found to be particularly advantageous in practice. [lacuna] in that a [lacuna] and a zigzag connector 32b are advantageous. A connector 32a with a ripple shape and illustrated in FIG. 5, as well as a zigzag-shaped connector 32b allows a reliable electrical contact to be made between the electrode layers due to its "ripple peaks" or its zigzags, without the respective elastic characteristics of the said materials being reduced. It is clear that the rippling or zigzagging of the connectors 32a,b which are in the form of wires must be chosen such that this does not make it harder to thread them in the grooves 14a–d or 24a–d (see FIGS. 2 to 4), respectively.

The electromechanical drives or sensor elements illustrated in FIGS. 2 to 4 and according to the invention are produced as follows. The method will be explained using the example of the piezoelectric element 10 illustrated in FIG. 2. Without any limitation of the invention, the method can also be applied to any other possible electromechanical drives or sensor elements according to the invention.

First of all, the ceramic disks 12*a–d* are produced from an electrically active material described above using a method which is normal in ceramics technology and having desired dimensions, with a margin of 2–3 mm being provided for each dimension, taking account of the subsequent mechanical machining. The ceramic disks 12*a–d* are then ground until a predetermined thickness s of, for example, 0.15 to 03 mm is reached. Once the desired groove 14*a–d* has been ground into each surface of a ceramic disk 12*a–d* to be metallized, in which case the groove must be no deeper than half the thickness S of the ceramic layer under consideration, the relevant surface, including the groove, is coated with a metal. This is achieved by applying a paste containing silver at least twice, followed by heat treatment at a temperature of 800–820° C. The ceramic disks are then connected to one another in the desired manner and depending on the desired alignment of the grooves, with two ceramic layers in each case being bonded to one another by gluing using cellulose adhesive. After this, the ceramic disks which have been joined by adhesive are placed in a suitable frame and are baked to form a monolithic structure with one another by diffusion welding at a temperature of 780–800° C. and single-axis compression at a pressure of 3–5 kg/cm$^2$ over a period of 3 hours, and are then cooled down to room temperature. One connector wire is drawn into each groove, with the electrode layers formed by the metallized layers being polarized in a desired manner by the action of an electric field on the connector wires at high temperature. The electrode layers are then connected to one another in the desired manner. After this, the desired parameters and the piezoelectric characteristics of the drive or of the sensor element are checked.

Figure 6:
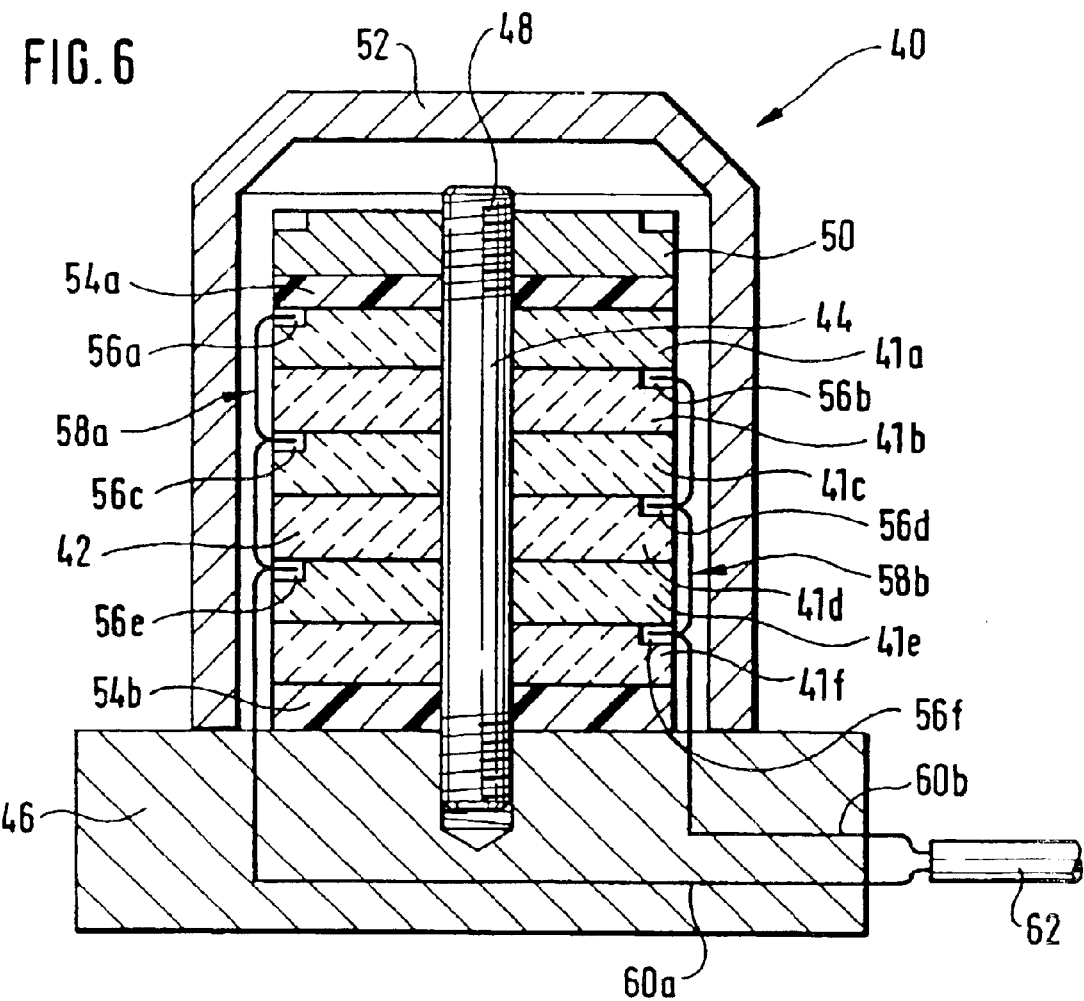
FIG. 6 shows a sectional illustration of an acceleration sensor having a multilayer piezoelectric sensor element according to the invention.

For the sake of completeness, FIG. 6 shows an acceleration sensor 40 which is equipped with a piezoelectric sensor according to the invention. The sensor element 42 comprises ceramic layers 41*a*, 41*b*, 41*c*, 41*d*, 41*e*, 41*f* which are in the form of plates, that is to say they are polygonal, and electrode layers which are arranged between them, which together form a monolithic multilayer capacitor, as already mentioned above. The sensor element 42 is mounted on a baseplate 46 by means of a mounting rod 44. To this end, the individual ceramic plates 41*a–f* have central openings in a similar way to those in the ceramic disks 22*a–d* in FIG. 4, which together form a central, axial passage through the sensor element 42. The mounting rod 44 is firmly connected to the baseplate 46, runs through the central, axial passage through the sensor element 42, and extends beyond it into a section which is provided with a thread 48. The sensor element 40 is thus placed over the mounting rod 44 and is secured by means of a retaining nut 50, which is screwed to the mounting rod 44, and is mechanically connected to the baseplate 46. Two insulation layers 54*a*, 54*b* are used for electrical insulation of the sensor element 40 from the baseplate 46 and from a cover 52, which forms a housing.

The sensor element 40 is essentially constructed in a similar way to the piezoelectric elements 10 and 20 shown in FIGS. 2 to 4. However, in contrast to them, grooves 56*a*, 56*b*, 56*c*, 56*d*, 56*e*, 56*f* are in this case provided for holding connectors 58*a*, 58*b* in the form of wires, and which grooves run on the outer edges, that is to say on the edges, of the ceramic plates 41*a–f*. The connectors 58*a,b*, which are in the form of wires and connect the electrodes of the same polarity in a desired manner, merge into electrical connecting conductors 60*a*, 60*b*, which are combined in a cable 62 which is in turn connected to measurement electronics, which are not shown here.

Figure 7:
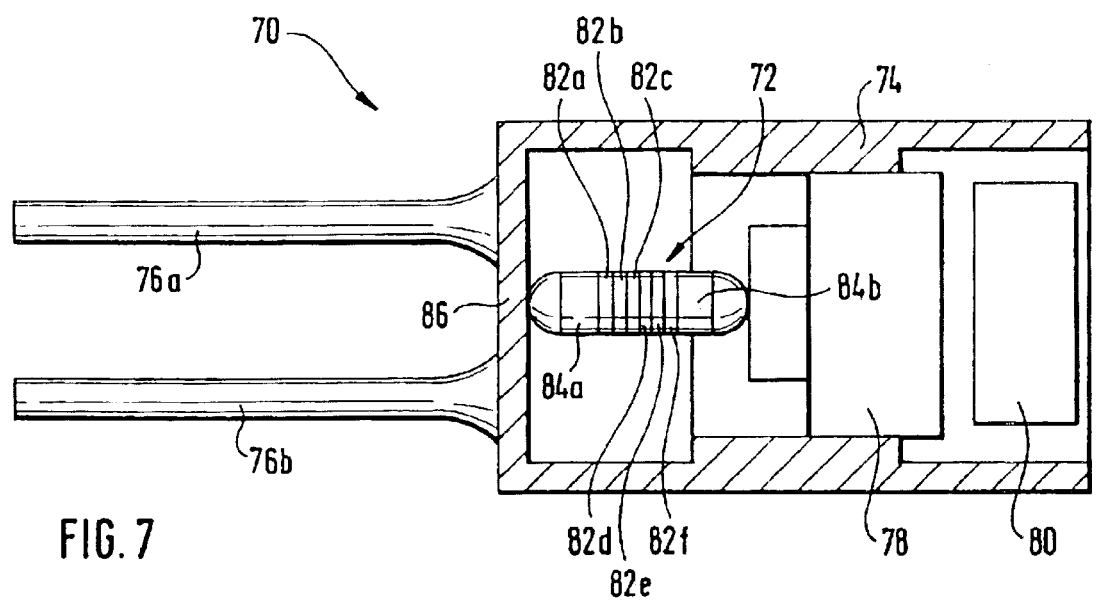
FIG. 7 shows a schematic, partially cutaway illustration of a level limit switch having a piezoelectric drive and a piezoelectric sensor element according to the invention.

By way of example, FIG. 7 shows a further measurement instrument, to be more precise a level measurement instrument: a level limit switch 70 which is equipped with a piezoelectric element 72 which is constructed as a monolithic block comprising both a drive and a sensor element according to the invention. The level limit switch 70 comprises a housing 74 and two oscillating rods 76*a*, 76*b* attached to it. Such a level limit switch, which has oscillating rods similar to a tuning fork, operates in ways which are generally known and which will thus not be explained any further here.

The piezoelectric element 72 is mounted in the interior of the housing 74 by means of a mounting element 78. The housing also holds drive and measurement electronics 80, which are illustrated schematically here.

The piezoelectric element 72 is, in principle, once again formed from piezoceramic disks 82*a*, 82*b*, 82*c*, 82*d*, 82*e*, 82*f* and electrode layers which are not identified in any more detail here, in a similar way to the piezoelectric element shown in FIG. 3. The difference in this case is that a sensor element is formed by the ceramic disks 82*a*, 82*b* and 82*c*, and a drive is formed by the ceramic disks 82*e* and 82*f*. In order to avoid undesirable stress effects from the drive element on the sensor element, a non-metallized ceramic disk 82*d* is provided between them.

The piezoelectric element 72 also has two terminating elements 84*a*, 84*b*, by means of which it rests on one side against a part of the housing 74 forming a membrane 86, and on the other side against the mounting element 78.

What is claimed is:

1. A method for producing an electromechanical drive or sensor element having a layer structure, which comprises the following steps:

production of ceramic layers composed of electrically active material using a method which is normal in ceramic technology, having desired dimensions and having a margin of 2–3 mm for each dimension taking account of the following mechanical machining;

grinding the ceramic layers until a predetermined thickness of, 0.15 to 03 mm is reached;

cutting a groove in one face of the ceramic layers which is to be metallized;

in which case the depth of the groove must be no deeper than half the thickness of the ceramic layer under consideration;

coating at least one face of the ceramic layers with metal by applying a paste containing silver twice and subsequent heat treatment at a temperature of 800–820° C.;

applying adhesive to the metallized surfaces of two ceramic layers using cellulose adhesive;

diffusion welding of the layers to which adhesive has been applied by heat treatment at a temperature of 780–800° C. and single-axis compression at a pressure of 3–5 kg/cm$^2$ over a period of 3 hours and cooling to room temperature;

drawing in each case one connector wire into a groove;

polarization of the drive or of the sensor element by the action of an electrical field on the wires at high temperature;

connection of the same poles of the drive or of the sensor element;

checking of the desired parameters and piezoelectric characteristics of the drive or of the sensor element.

2. The method of claim 1, wherein the ceramic layers are piezoelectric ceramic layers composed of PZT material.

3. The method of claim 1, wherein the ceramic layers are piezoelectric ceramic layers composed of $PbMg_{0.308}Nb_{0.617}Ti_{0.075}O_3$.

4. The method of claim 1, wherein the ceramic layers are piezoelectric ceramic layers composed of a material having a Curie temperature of more than 400° C.

5. The method of claim 1, wherein the ceramic layers are piezoelectric ceramic layers composed of a material selected from the group consisting of $Na_{0.5}Bi_{4.5}Ti_4O_{15}$ and $Bi_3TiNbO_9$.

6. The method of claim 1, wherein the groove depth is approximately 0.3 times the thickness of the corresponding ceramic layer.

* * * * *